United States Patent
Liu et al.

(10) Patent No.: US 9,226,427 B2
(45) Date of Patent: Dec. 29, 2015

(54) DOCKING STATION

(71) Applicants: Chung-Luen Liu, Taipei (TW);
Jenq-Haur Pan, Taipei (TW);
Chang-Yuan Wu, Taipei (TW);
Ching-Ya Tu, Taipei (TW);
Ching-Chung Chen, Taipei (TW)

(72) Inventors: Chung-Luen Liu, Taipei (TW);
Jenq-Haur Pan, Taipei (TW);
Chang-Yuan Wu, Taipei (TW);
Ching-Ya Tu, Taipei (TW);
Ching-Chung Chen, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 375 days.

(21) Appl. No.: 13/710,475

(22) Filed: Dec. 11, 2012

(65) Prior Publication Data
US 2013/0148298 A1    Jun. 13, 2013

Related U.S. Application Data

(60) Provisional application No. 61/569,284, filed on Dec. 11, 2011.

(51) Int. Cl.
*H05K 7/20* (2006.01)
*G06F 1/20* (2006.01)
*G06F 1/16* (2006.01)
*H01L 23/473* (2006.01)

(52) U.S. Cl.
CPC .......... *H05K 7/20145* (2013.01); *G06F 1/1632* (2013.01); *G06F 1/20* (2013.01)

(58) Field of Classification Search
CPC ............. H05K 7/20; H05K 7/20218–7/20381; H05K 7/20409–7/20418; H05K 7/20009–7/202; H01L 23/46–23/3677; G06F 1/181–1/182

USPC ........................ 361/679.46–679.54, 688–723, 361/676–678; 165/80.1–80.5, 104.33, 185; 174/15.1–15.3, 16.1–16.3, 547–548; 257/712–722, E23.088; 454/184; 312/236

See application file for complete search history.

(56) References Cited

U.S. PATENT DOCUMENTS

| | | | | |
|---|---|---|---|---|
| 5,704,212 A | * | 1/1998 | Erler et al. ........................ 62/3.2 |
| 5,959,836 A | * | 9/1999 | Bhatia ....................... 361/679.41 |
| 6,094,347 A | * | 7/2000 | Bhatia ............................ 361/695 |
| 6,118,654 A | * | 9/2000 | Bhatia ....................... 361/679.52 |
| 6,239,970 B1 | * | 5/2001 | Nakai et al. .................... 361/695 |

(Continued)

FOREIGN PATENT DOCUMENTS

TW     517505     1/2003
TW     M322018    11/2007

(Continued)

OTHER PUBLICATIONS

"Office Action of Taiwan Counterpart Application", issued on Dec. 8, 2014, p. 1-p. 8.

*Primary Examiner* — Anthony Haughton
*Assistant Examiner* — Razmeen Gafur
(74) *Attorney, Agent, or Firm* — Jianq Chyun IP Office

(57) ABSTRACT

A docking station suitable for a portable electronic device includes a base, a supporting component and a first fan. The base includes an airflow guiding slope. The supporting component is disposed on the base and has an airflow guiding structure, in which the portable electronic device is configured to be supported on the supporting component. The first fan is disposed in the base and provides a cooling airflow, in which the airflow guiding slope and the airflow guiding structure guide the cooling airflow to flow into the portable electronic device.

16 Claims, 2 Drawing Sheets

(56) References Cited

U.S. PATENT DOCUMENTS

| | | | |
|---|---|---|---|
| 6,313,987 B1* | 11/2001 | O'Connor et al. | 361/679.46 |
| 6,415,612 B1* | 7/2002 | Pokharna et al. | 62/3.2 |
| 6,522,535 B1* | 2/2003 | Helot et al. | 361/679.49 |
| 6,542,360 B2* | 4/2003 | Koizumi | 361/679.47 |
| 6,674,640 B2* | 1/2004 | Pokharna et al. | 361/679.48 |
| 6,711,014 B2* | 3/2004 | Anzai et al. | 361/679.48 |
| 6,837,057 B2* | 1/2005 | Pokharna et al. | 62/3.2 |
| 6,837,058 B1* | 1/2005 | McEuen et al. | 62/3.2 |
| 6,966,358 B2* | 11/2005 | Rapaich | 165/80.4 |
| 7,301,767 B2* | 11/2007 | Takenoshita et al. | 361/695 |
| 7,821,782 B2* | 10/2010 | Doherty et al. | 361/679.26 |
| 7,872,864 B2 | 1/2011 | Mongia et al. | |
| 7,974,090 B2* | 7/2011 | Risher-Kelly | 361/679.47 |
| 2001/0030851 A1* | 10/2001 | Usui et al. | 361/687 |
| 2001/0033475 A1* | 10/2001 | Lillios et al. | 361/687 |
| 2002/0012228 A1* | 1/2002 | Ozaki et al. | 361/687 |
| 2002/0018335 A1* | 2/2002 | Koizumi | 361/687 |
| 2004/0123604 A1* | 7/2004 | Pokharna et al. | 62/3.2 |
| 2004/0261421 A1* | 12/2004 | McEuen et al. | 62/3.2 |
| 2005/0161197 A1* | 7/2005 | Rapaich | 165/80.4 |
| 2006/0126289 A1* | 6/2006 | Takenoshita et al. | 361/687 |
| 2006/0126290 A1* | 6/2006 | Park | 361/687 |
| 2009/0086428 A1* | 4/2009 | Campbell et al. | 361/694 |
| 2009/0268404 A1* | 10/2009 | Chu et al. | 361/696 |
| 2010/0079940 A1* | 4/2010 | Mongia et al. | 361/679.49 |
| 2010/0309622 A1* | 12/2010 | Zimmermann et al. | 361/679.41 |

FOREIGN PATENT DOCUMENTS

| | | |
|---|---|---|
| TW | M377791 | 4/2010 |
| TW | M417594 | 12/2011 |

* cited by examiner

DOCKING STATION

CROSS-REFERENCE TO RELATED APPLICATION

This application claims the priority benefits of U.S. provisional application Ser. No. 61/569,284, filed on Dec. 11, 2011. The entirety of the above-mentioned patent applications is hereby incorporated by reference herein and made a part of this specification.

BACKGROUND

1. Field of the Disclosure

The disclosure generally relates to a docking station, and more particularly, to a docking station suitable for a portable electronic device.

2. Description of Related Art

With the rapid development of science and technology, the portable electronic device such as tablet computer or smart phones has been widely used due to the advantage thereof of portable carrying and operation simplicity.

Taking a tablet computer as an example, along with the continuous progress thereof towards slimming figure, the thickness and the internal layout space are reduced accordingly, which is unable to provide an enough space to dispose a fan with larger air output and the cooling efficiency of the tablet computer itself is limited. In addition, the central processing unit (CPU) in some tablet computers is designed to switch a higher operation frequency or a lower operating frequency to adapt to different application modes. Thus, if a tablet computer is unable to provide enough space therein for disposing a fan with larger air output, when the CPU is switched to work in a higher operation frequency to generate more thermal energy, the insufficient cooling efficiency problem occurs.

SUMMARY OF THE DISCLOSURE

Accordingly, the disclosure is directed to a docking station capable of advancing the cooling efficiency of a portable electronic device.

The disclosure provides a docking station suitable for a portable electronic device and includes a base, a supporting component and a first fan. The base includes an airflow guiding slope. The supporting component is disposed on the base and has an airflow guiding structure, in which the portable electronic device is configured to be supported on the supporting component. The first fan is disposed in the base and provides a cooling airflow, in which the airflow guiding slope and the airflow guiding structure guide the cooling airflow to flow into the portable electronic device.

In an embodiment of the disclosure, the portable electronic device has a heat-generating component therein and the cooling airflow is guided to flow through the heat-generating component by the airflow guiding structure.

In an embodiment of the disclosure, the portable electronic device has a heat-dissipating module therein and the cooling airflow is guided to flow through the heat-dissipating module by the airflow guiding structure.

In an embodiment of the disclosure, the portable electronic device has a second fan therein and the cooling airflow is guided to flow through the second fan by the airflow guiding structure.

In an embodiment of the disclosure, the air output of the first fan is greater than the air output of the second fan.

In an embodiment of the disclosure, the supporting component has an airflow channel, the airflow guiding structure is located in the airflow channel and the portable electronic device is aligned with the airflow channel.

In an embodiment of the disclosure, the base has a first air outlet, and an inner part of the base is communicated with the supporting component via the first air outlet.

In an embodiment of the disclosure, the first fan includes a casing and a set of fan blades. The casing has a second air outlet, in which the second air outlet is aligned with the first air outlet and has a first outflow direction. The set of fan blades is disposed in the casing and has a second outflow direction, in which the first outflow direction is perpendicular to the second outflow direction.

In an embodiment of the disclosure, the airflow guiding slope makes the cooling airflow flow to the first air outlet from the second air outlet.

In an embodiment of the disclosure, the airflow guiding slope is located at the casing.

In an embodiment of the disclosure, the set of fan blades rotates around an axis and the second outflow direction is perpendicular to the axis.

In an embodiment of the disclosure, the base has a barrier therein, and the barrier extends to the first fan from an edge of the first air outlet.

In an embodiment of the disclosure, the airflow guiding structure extends to the portable electronic device from an edge of the first air outlet.

In an embodiment of the disclosure, the portable electronic device has an air inlet, and the supporting component is communicated with the inner part of the portable electronic device via the air inlet.

In an embodiment of the disclosure, the airflow guiding structure extends to an edge of the air inlet.

In an embodiment of the disclosure, the docking station further includes a control component, in which when the portable electronic device is placed on the supporting component, the control component drives the first fan to provide the cooling airflow.

In an embodiment of the disclosure, the docking station further includes a sensing component for sensing whether the portable electronic device is disposed on the supporting component and for sending out a signal to the control component.

In an embodiment of the disclosure, the portable electronic device has a heat-generating component, the heat-generating component has a first operating frequency and a second operating frequency, the first operating frequency is greater than the second operating frequency, and when the heat-generating component is switched to the first operating frequency, the control component drives the first fan to provide the cooling airflow.

Based on the depiction above, the docking station of the disclosure uses the supporting component to support the portable electronic device and uses the airflow guiding structure of the supporting component to guide the cooling airflow provided by the first fan of the docking station into the portable electronic device. In this way, when the portable electronic device has insufficient inner space to employ a fan with larger air output therein, the first fan of the docking station can provide a cooling airflow to increase the flow of cooling airflow inside the portable electronic device so as to effectively advance the cooling efficiency.

In order to make the features and advantages of the present disclosure more comprehensible, the present disclosure is further described in detail in the following with reference to the embodiments and the accompanying drawings.

DESCRIPTION OF THE EMBODIMENTS

Figure 1:
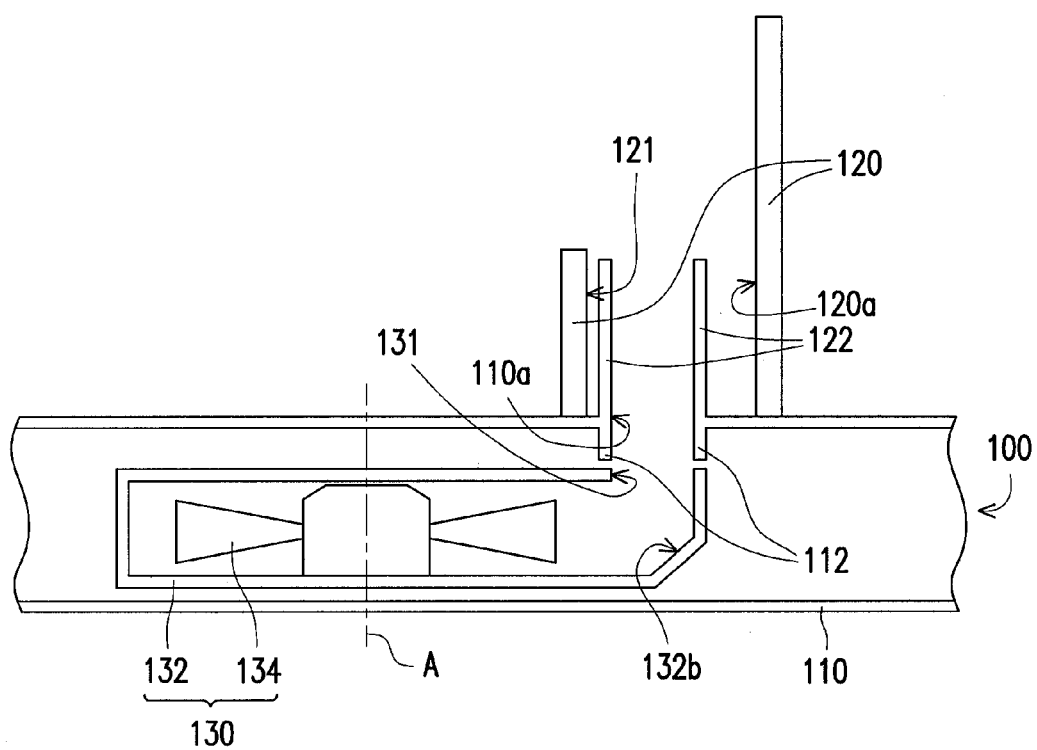
FIG. 1 is a schematic diagram of a docking station according to an embodiment of the disclosure.

FIG. 1 is a schematic diagram of a docking station according to an embodiment of the disclosure. Referring to FIG. 1, a docking station 100 in the embodiment includes a base 110, a supporting component 120 and a first fan 130. The supporting component 120 is disposed on the base 110 and has an airflow guiding structure 122. The first fan 130 is disposed in the base 110. The supporting component 120 has a third air outlet 121 and is connected to a second air outlet 131 of the first fan 130 through the airflow guiding structure 122.

Figure 2:
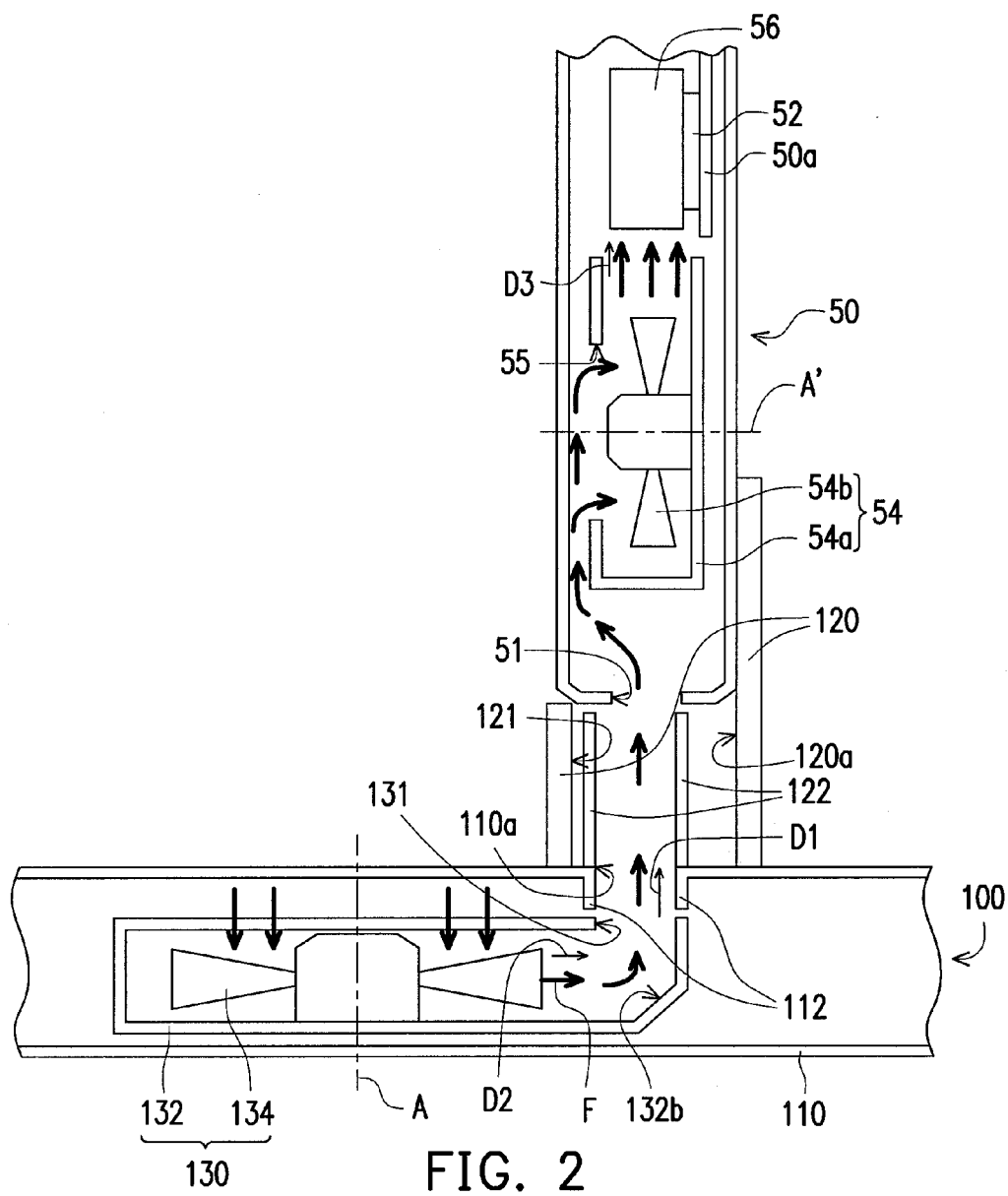
FIG. 2 is a diagram of combining the docking station of FIG. 1 and a portable electronic device.

FIG. 2 is a diagram of combining the docking station of FIG. 1 and a portable electronic device. Referring to FIG. 2, the docking station 100 is a portable electronic device 50 suitable for, for example, a tablet computer. The portable electronic device 50 is configured to be supported on the supporting component 120 to make the docking station 100 combine with the portable electronic device 50. The first fan 130 is configured to provide a cooling airflow F, and the airflow guiding structure 122 of the supporting component 120 is configured to guide the cooling airflow F entering the portable electronic device 50. In this way, when the portable electronic device 50 has insufficient inner space to employ a fan with larger air output therein, the first fan 130 of the docking station 100 can provide a cooling airflow F to increase the flow of cooling airflow therein so as to effectively advance the cooling efficiency. The casing of the portable electronic device 50 further contains a first air inlet 51. When the portable electronic device 50 is inserted into the supporting component 120 on the base 110, the third air outlet 121 and the first air inlet 51 together form an unblocked channel to smoothly guide the cooling airflow into the portable electronic device 50.

In the embodiment, in addition to the first fan 130 for providing the cooling airflow F into the portable electronic device 50, the docking station 100 further has a keyboard module or other peripheral devices to provide the portable electronic device 50 with more external connecting functions, which the disclosure is not limited to.

The portable electronic device 50 in the embodiment has a circuit board 50a, a heat-generating component 52 and a heat-dissipating module 56 therein. The heat-generating component 52 is, for example, a CPU disposed on the circuit board 50a. The heat-dissipating module 56 is, for example, a cooling fin group and disposed on the heat-generating component. Depending on different product designs, the heat-dissipating module can be disposed surrounding the heat-generating component, and a heat pipe can be employed to link the heat-dissipating module and the heat-generating component, so as to use the heat-dissipating module for cooling the heat-generating component, which the disclosure is not limited to. The portable electronic device 50 further has a second fan 54 corresponding to the heat-generating component 52 and the heat-dissipating module 56. The cooling airflow F provided by the first fan 130 is guided by the airflow guiding structure 122 to flow into a second air inlet 55 of the second fan 54, and then, pass through the second fan 54 and reach the heat-generating component 52 and the heat-dissipating module 56. When the cooling airflow F provided by the first fan 130 is larger, a part of the cooling airflow F can directly cool the heat-generating component 52 and the heat-dissipating module 56 by passing through the gap between the second fan 54 and the casing of the portable electronic device 50 without taking the air-guiding path of the second fan, which depends on the different product designs. In more details, the volume of the second fan 54 is usually less than the volume of the first fan 130, and the air output of the first fan 130 is, for example, greater than or equal to the air output of the second fan 54, and the heat-generating component 52 can be switched to a higher first operating frequency or a lower second operating frequency by design to adapt different application modes. Since the inner space of the portable electronic device 50 is limited, when the heat-generating component 52 is switched to the first operating frequency and thereby produces more thermal energy, the second fan 54 with smaller volume and air output may fail to provide sufficient cooling airflow for cooling the heat-generating component 52 and the heat-dissipating module 56. At the time, the cooling airflow F provided by the first fan 130 can increase the flow of cooling airflow inside the portable electronic device, which can effectively cool the heat-generating component 52 and the heat-dissipating module 56.

In another embodiment of the disclosure, the portable electronic device 50 can have no second fan 54. At the time, the cooling airflow F directly flows to the heat-generating component 52 and the heat-dissipating module 56 from the first air inlet 51 for cooling the heat-generating component 52 and the heat-dissipating module 56. In yet another embodiment of the disclosure, the portable electronic device 50 does not have the heat-dissipating module 56, but the cooling airflow F flows into the second fan 54, passes through the second fan 54 and then reaches the heat-generating component 52. In yet another embodiment of the disclosure, the portable electronic device 50 does not have the second fan 54 and the heat-dissipating module 56, but the cooling airflow F directly flows to the heat-generating component 52 from the first air inlet 51 for cooling the heat-generating component 52.

When the portable electronic device 50 has the second fan 54, the cooling airflow F can flow into the second fan 54, pass through the second fan 54 and then flow to the heat-generating component 52 or the heat-dissipating module 56. In addition, it can be also to allow partial the cooling airflow F flowing into the second fan 54 and allow the other part of the cooling airflow F directly flowing to the heat-generating component 52 or the heat-dissipating module 56. The disclosure does not limit the flowing path of the cooling airflow in the portable electronic device 50.

Along with the different product designs, the airflow guiding structure 122 on the supporting component 120 can merely contact the casing at both sides of the first air inlet 51 of the portable electronic device 50 to form a channel, so that the cooling airflow F smoothly flows into the portable electronic device 50. In addition, the airflow guiding structure 122 on the supporting component 120 can be directly inserted into the first air inlet 51 of the portable electronic device 50, so that the cooling airflow F flowing out from the third air outlet 121 on the supporting component can directly enter the portable electronic device. When the second fan takes the lateral inflow and the lateral outflow, the airflow guiding structure 122 on the supporting component 120 can combine with the casing at both sides of the second air inlet 55 of the second fan 54 to smoothly guide the cooling airflow provided by the first fan 130 into the second fan 54.

Figure 3:
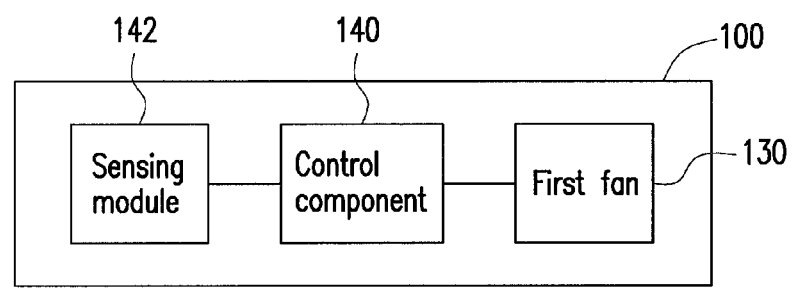
FIG. 3 is a block diagram of the docking station of FIG. 1.

FIG. 3 is a block diagram of the docking station of FIG. 1. Referring to FIG. 3, the docking station 100 in the embodiment further includes a control component 140 and a sensing module 142. When the portable electronic device 50 is placed on the supporting component 120 as shown by FIG. 2, the sensing module 142 is triggered so that the control component 140 can receive the signal from the sensing module 142 to drive the first fan 130 for providing the cooling airflow F to the portable electronic device 50. At the time, the portable electronic device 50 is combined with the docking station 100 to have a better cooling efficiency. In addition, the control component 140 can be also specified not to drive the first fan 130 to provide the cooling airflow F when the portable electronic device 50 is placed on the supporting component 120 and the heat-generating component 52 is switched to the second operating frequency; the control component 140 can be further specified to start driving the first fan 130 to provide the cooling airflow F when the portable electronic device 50 is placed on the supporting component 120 and the heat-generating component 52 is switched to the first operating frequency and a signal is sent to the control component 140, which can save power and avoid the noise produced during continuously running the first fan 130. All the above-mentioned settings can be changed depending on the requirements. The control component 140 can be triggered by the portable electronic device 50 through a mechanical switch or an electronic switch, which the disclosure is not limited to.

Referring to FIG. 2 again, the supporting component 120 in the embodiment has an airflow channel 120a, the airflow guiding structure 122 is located in the airflow channel 120a and the portable electronic device 50 is aligned with the airflow channel 120a. The base 110 has a first air outlet 110a, and the inner part of the base 110 is communicated with the airflow channel 120a of the supporting component 120 and the second air outlet 131 via the first air outlet 110a. The portable electronic device 50 has a first air inlet 51, the supporting component 120 is communicated with the inner part of the portable electronic device 50 via the first air inlet 51, and the airflow guiding structure 122 extends to the portable electronic device 50 from the edge of the first air outlet 110a and reaches the edge of the first air inlet 51. In addition, there is a barrier 112 in the base 110. The barrier 112 extends to the second air outlet 131 of the first fan 130 from the edge of the first air outlet 110a. In this way, the barrier 112, the first air outlet 110a, the airflow guiding structure 122 and the first air inlet 51 sequentially guide the cooling airflow F, so that the cooling airflow F can more completely enter the portable electronic device 50.

In the embodiment, the first fan 130 includes a casing 132 and a set of fan blades 134. The casing 132 has a second air outlet 131, and the second air outlet 131 is aligned with the first air outlet 110a and has a first outflow direction D1. The fan blades 134 are disposed in the casing 132 and rotate around an axis A. The axis A is parallel to the first outflow direction D1. The first fan 130 takes, for example, axial inflow/lateral outflow, in which the airflow is parallel to the axis A and enters the first fan 130 from the casing 132, and then is expelled by the fan blades 134 along a second outflow direction D2 perpendicular to the axis A. Under the above-mentioned layout, the first outflow direction D1 of the second air outlet 131 is perpendicular to the second outflow direction D2 of the fan blades 134. In order to make the cooling airflow F more unblocked flow sequentially along the second outflow direction D2 and the first outflow direction D1 perpendicular to the second outflow direction D2, the casing 132 in the embodiment has an airflow guiding slope 132b for guiding the cooling airflow F flowing to the second air outlet 131 from the fan blades 134 and making the cooling airflow F flowing to the first air outlet 110a from the second air outlet 131. Depending on the different product designs, the airflow guiding slope 132b can be disposed on the casing of the base 110 in association with the barrier 112, so that the cooling airflow F can be smoothly guided into the portable electronic device 50.

In the embodiment, the second fan 54 is also, for example, in axial inflow mode/lateral outflow mode. The fan blades 54b are disposed in the casing 54a and rotate around an axis A'. At the time, the airflow flows along a third outflow direction D3 perpendicular to the axis A' and is expelled by the fan blades 54b. In other embodiments, the first fan 130 can be in axial inflow mode/axial outflow mode or in lateral inflow mode/axial outflow mode and the second fan 54 can be in axial inflow mode/axial outflow mode or in lateral inflow mode/axial outflow mode, which the disclosure is not limited to.

In summary, the docking station of the disclosure uses the supporting component thereof to support the portable electronic device and uses the airflow guiding structure of the supporting component to guide the cooling airflow provided by the first fan of the docking station into the portable electronic device. In this way, when the portable electronic device has insufficient inner space to employ a fan with larger air output therein, the first fan of the docking station can provide a cooling airflow to increase the flow of cooling airflow inside the portable electronic device so as to effectively advance the cooling efficiency. In addition, a airflow guiding slope is formed at the casing of the first fan or at the casing of the base and a barrier is formed in the base, so that through the airflow guiding slope and the barrier, the cooling airflow can be guided more completely enter the portable electronic device to further advance the cooling efficiency of the portable electronic device.

It will be apparent to those skilled in the art that the descriptions above are several preferred embodiments of the disclosure only, which does not limit the implementing range of the disclosure. Various modifications and variations can be made to the structure of the disclosure without departing from the scope or spirit of the disclosure. The claim scope of the disclosure is defined by the claims hereinafter.

What is claimed is:

1. A docking station, suitable for a portable electronic device and comprising:
    a base, comprising an airflow guiding slope;
    a supporting component, disposed on the base and having an airflow guiding structure, wherein the portable electronic device is configured to be supported on the supporting component; and
    a first fan, disposed in the base and providing a cooling airflow, wherein the airflow guiding slope and the airflow guiding structure guide the cooling airflow to flow into the portable electronic device, wherein the portable electronic device has a second fan therein, the cooling airflow is guided to flow through the second fan by the airflow guiding structure, and an air output of the first fan is greater than an air output of the second fan.

2. The docking station as claimed in claim 1, wherein the portable electronic device has a heat-generating component therein and the cooling airflow is guided to flow through the heat-generating component by the airflow guiding structure.

3. The docking station as claimed in claim 1, wherein the portable electronic device has a heat-dissipating module therein and the cooling airflow is guided to flow through the heat-dissipating module by the airflow guiding structure.

4. The docking station as claimed in claim 1, wherein the supporting component has an airflow channel, the airflow guiding structure is located in the airflow channel and the portable electronic device is aligned with the airflow channel.

5. The docking station as claimed in claim 1, wherein the base has a first air outlet, and an inner part of the base is communicated with the supporting component via the first air outlet.

6. The docking station as claimed in claim 5, wherein the first fan comprises:
 a casing, having a second air outlet, wherein the second air outlet is aligned with the first air outlet and has a first outflow direction; and
 a set of fan blades, disposed in the casing and having a second outflow direction, wherein the first outflow direction is perpendicular to the second outflow direction.

7. The docking station as claimed in claim 6, wherein the airflow guiding slope makes the cooling airflow flow to the first air outlet from the second air outlet.

8. The docking station as claimed in claim 7, wherein the airflow guiding slope is located at the casing.

9. The docking station as claimed in claim 6, wherein the set of fan blades rotates around an axis and the second outflow direction is perpendicular to the axis.

10. The docking station as claimed in claim 5, wherein the base has a barrier therein, and the barrier extends to the first fan from an edge of the first air outlet.

11. The docking station as claimed in claim 5, wherein the airflow guiding structure extends to the portable electronic device from an edge of the first air outlet.

12. The docking station as claimed in claim 1, wherein the portable electronic device has an air inlet, and the supporting component is communicated with an inner part of the portable electronic device via the air inlet.

13. The docking station as claimed in claim 12, wherein the airflow guiding structure extends to an edge of the air inlet.

14. The docking station as claimed in claim 1, further comprising a control component, wherein when the portable electronic device is placed on the supporting component, the control component drives the first fan to provide the cooling airflow.

15. The docking station as claimed in claim 14, further comprising a sensing component for sensing whether the portable electronic device is disposed on the supporting component and for sending out a signal to the control component.

16. The docking station as claimed in claim 14, wherein the portable electronic device has a heat-generating component, the heat-generating component has a first operating frequency and a second operating frequency, the first operating frequency is greater than the second operating frequency, and when the heat-generating component is switched to the first operating frequency, the control component drives the first fan to provide the cooling airflow.

* * * * *